United States Patent
Hosokawa et al.

(10) Patent No.: US 7,313,045 B2
(45) Date of Patent: Dec. 25, 2007

(54) DYNAMIC SEMICONDUCTOR STORAGE DEVICE

(75) Inventors: Kohji Hosokawa, Ohtsu (JP); Hisatada Miyatake, Ohtsu (JP); Toshio Sunaga, Ohtsu (JP)

(73) Assignee: International Business Machines Corporation, Armonk, NY (US)

( * ) Notice: Subject to any disclaimer, the term of this patent is extended or adjusted under 35 U.S.C. 154(b) by 57 days.

(21) Appl. No.: 10/553,578

(22) PCT Filed: Apr. 13, 2004

(86) PCT No.: PCT/JP2004/005275

§ 371 (c)(1),
(2), (4) Date: Oct. 17, 2005

(87) PCT Pub. No.: WO2004/093089

PCT Pub. Date: Oct. 28, 2004

(65) Prior Publication Data

US 2006/0250873 A1    Nov. 9, 2006

(30) Foreign Application Priority Data

Apr. 15, 2003    (JP) .............................. 2003-110319

(51) Int. Cl.
*G11C 7/00*    (2006.01)

(52) U.S. Cl. .................................. 365/222; 365/225.7
(58) Field of Classification Search ................ 365/222, 365/225.7
See application file for complete search history.

(56) References Cited

U.S. PATENT DOCUMENTS

| 6,327,208 B1 * | 12/2001 | Kitade .................... 365/222 |
| 6,366,517 B1 * | 4/2002 | Tsujino et al. ........... 365/225.7 |
| 6,483,764 B2 * | 11/2002 | Chen Hsu et al. .......... 365/222 |
| 6,693,838 B2 * | 2/2004 | Hagura et al. .............. 365/222 |
| 6,751,145 B2 * | 6/2004 | Feurle et al. ................ 365/222 |

FOREIGN PATENT DOCUMENTS

| JP | 4034794 | 5/1992 |
| JP | 5109268 | 4/1993 |
| JP | 5002878 | 8/1993 |
| JP | 5266657 | 10/1993 |

* cited by examiner

Primary Examiner—Connie C. Yoha
(74) Attorney, Agent, or Firm—Michael J. LeStrange

(57) ABSTRACT

To achieve, by a simple circuit configuration, a DRAM that permits refresh current to be effectively reduced by selectively setting refresh cycles. A memory cell array is divided into 64 subarrays, and each subarray is further divided into 8 blocks. A refresh cycle control circuit has a fuse circuit for setting a frequency dividing ratio of 1 or 1/2, a frequency divider that divides the frequency of a predecode signal by the set frequency dividing ratio, fuse circuits for setting a frequency dividing ratio of 1 or 1/4, and frequency dividers for dividing predecode signals by the set frequency dividing ratio. The refresh cycle control circuit is capable of setting a 64-ms or 128-ms refresh cycle for the 64 subarrays and a 64-ms or 256-ms refresh cycle for 512 blocks.

2 Claims, 13 Drawing Sheets

FC

DYNAMIC SEMICONDUCTOR STORAGE DEVICE

CROSS REFERENCE TO RELATED APPLICATIONS AND INCORPORATION BY REFERENCE

This application is based upon and claims the benefit of priority of a 371 of PCT/JP04/05275 filed Apr. 13, 2004. This application also claims the benefit of priority from Japanese Patent Application 2003110319 filed on Apr. 15, 2003; the entire contents of which are incorporated by reference herein.

FIELD OF THE INVENTION

The present invention relates to a dynamic semiconductor memory device and, more particularly, to a dynamic random access memory (DRAM) in which a refresh cycle interval is selectively controlled to reduce power dissipation.

BACKGROUND OF THE INVENTION

Reducing power dissipation of integrated circuits in battery-driven equipment, such as a cellular telephone or a personal digital assistant (PDA), is a significant challenge. Previously, static random access memories (SRAMs) have been used extensively in semiconductor memory applications, because a SRAM memory cell typically has six complementary metal oxide semiconductor (CMOS) transistors and allows data to be retained with a minimal amount of current drain. In terms of area, however, the SRAM memory cell, is larger than a DRAM memory cell by a factor of twenty or more. In addition, memory capacities are increasing proportionately with circuit and wiring densities. As such, fabricating a 32-Mbit or 64-Mbit SRAM using current wiring technology of about 0.2 µm to about 0.13 µm inevitably results in an excessively large chip. Consequently, from the viewpoint of area efficiency, SRAMs are inferior to DRAMs, and the disadvantage of poor area efficiency ultimately inhibits continued process technology scaling. For this reason, in many applications SRAMs are being replaced by DRAMs.

The DRAMs, however, require stored data to be refreshed, resulting in a considerably larger standby current than for SRAM arrays. To successfully replace SRAMs consuming less power with space-saving DRAMs, a trade-off is made between array density and stand-by power dissipation.

To solve the problem described above, a multi-chip package that combines a large-capacity DRAM and a small-capacity SRAM has been provided. The SRAM serves to back up the DRAM, and only the data that has to be retained among the data in the DRAM is stored in the SRAM. Even this product, however, has not achieved satisfactory reduction in power consumption.

According to a typical standard of DRAMs, a specified data retention rate is 64 ms. A memory controller is required to refresh each memory cell in a cycle bounded by the specified data retention rate. DRAM manufacturers conduct a "retention test" with sufficient margins to satisfy the aforementioned requirement and ship the products passing the test. The total number of memory cells exhibiting a retention rate with an extremely small margin is rather small compared to the number of cells in the array. Furthermore, memory cells having such short data retention rates usually exhibit one or more defects and are replaced by redundant memory cells and not actually used. Hence, the number of the memory cells with short data retention rates that are actually used is extremely small, as compared with the overall number of memory cells in the DRAM array under test.

Actual measurements of data retention time show that most DRAMs of any manufacturers exhibit long retention that easily exceeds the range of several seconds even at 85° C. For the retention test, an allowance is added to 64 ms to provide a reference value of, for example, 100 ms. For a given array, only a few dozen memory cells are incapable of exceeding the reference value. Typical distributions of data retention rates indicates that about 99% of the memory cells have data retention rates exceeding one second and an extremely small number of memory cells are distributed at the bottom where the data retention time is relatively short.

In a conventional DRAM, all memory cells are refreshed at the same interval, e.g., 64 ms, according to the standard, which ensures the shortest data retention rate of all memory cells is used for the refresh cycle. The study of the capability distribution of data retention rates described above reveals that the majority of memory cells are refreshed more frequently than necessary, wasting a considerable amount of power. Ideally, therefore, individual memory cells should be refreshed at intervals suited to the data retention rate capability of each memory cell. Thus, only a few dozen memory cells in a given array need refreshing at the shortest intervals of 64 ms, while the remaining majority of memory cells may be refreshed at intervals that are far longer, allowing considerable power to be saved. However, setting a refresh cycle based on the capability value of each memory cell would require a circuit of an enormous scale and complexity, rendering such a solution infeasible.

To solve the problem described above, an invention has been proposed in which memory cells are divided into groups and an optimum refresh cycle is set for each group. For instance, Japanese Unexamined Patent Application Publication No. 4-34794 discloses an invention in which an optimum refresh cycle is set for each word line. This invention, however, requires a circuit of an enormous scale and complexity to set different refresh cycles for numerous word lines. Japanese Unexamined Patent Application Publication No. 5-109268 discloses an invention in which an optimum refresh cycle is set for each subarray. Japanese Unexamined Patent Application Publication No. 5-266657 shown below has disclosed an invention in which an optimum refresh cycle is set for each memory cell array. In these inventions, however, the number of arrays is small, so that a satisfactory result cannot be obtained if memory cells having comparably short values of data retention rate are scattered among all arrays.

SUMMARY OF THE INVENTION

An object of the present invention is to provide a dynamic semiconductor memory device requiring reduced refresh current. Another object of the present invention is to provide a dynamic semiconductor memory device capable of selecting refresh cycles at varying intervals.

Still another object of the present invention is to provide a dynamic semiconductor memory device that fulfills the above objects by a simple circuit configuration.

A dynamic semiconductor memory device according to the present invention has a memory cell array that includes a plurality of memory cells. The memory cell array is divided into a plurality of blocks. The dynamic semiconductor memory device further includes a block decoder, a refresh cycle control circuit, and a row decoder. The block decoder decodes row address signals to generate block selection signals. The refresh cycle control circuit divides block selection signals by a preset frequency dividing ratio to set refresh cycles for the blocks. The row decoder selects blocks for refresh in response to the block selection signals.

In the dynamic semiconductor memory device, the frequency of a block selection signal is divided by a preset frequency dividing ratio. If the frequency dividing ratio is 1, then the block selection signal is not divided, so that the associated block will be selected at a normal interval. If the frequency dividing ratio is 1/2, then the block selection signal is divided by 1/2, so that the associated block will be selected at an interval that is half the normal interval. Hence, the refresh cycle of this block will be half the normal interval, thus reducing the refresh current. The frequency dividing ratio is not particularly limited to 1/2, and an arbitrary ratio, such as 1/4 or 1/8, may be used. Moreover, the refresh current is reduced merely by adding a refresh cycle control circuit, allowing the dynamic semiconductor memory device in accordance with the present invention to be achieved by a simple circuit implementation.

Another dynamic semiconductor memory device in accordance with the present invention has a memory cell array that includes a plurality of memory cells. The memory cell array is divided into a plurality of first hierarchical blocks. Each of the first hierarchical blocks is further divided into a plurality of second hierarchical blocks. The dynamic semiconductor memory device further includes a refresh cycle setting device, which sets a first refresh cycle for the first hierarchical blocks and a second refresh cycle for the second hierarchical blocks.

In this dynamic semiconductor memory device, the memory cell array is hierarchically divided into blocks, and the refresh cycles are hierarchically set for each block. This arrangement permits detailed setting of refresh cycles, resulting in further reduced refresh current of the entire memory cell array.

DETAILED DESCRIPTION OF THE PREFERRED EMBODIMENTS

Figure 1:
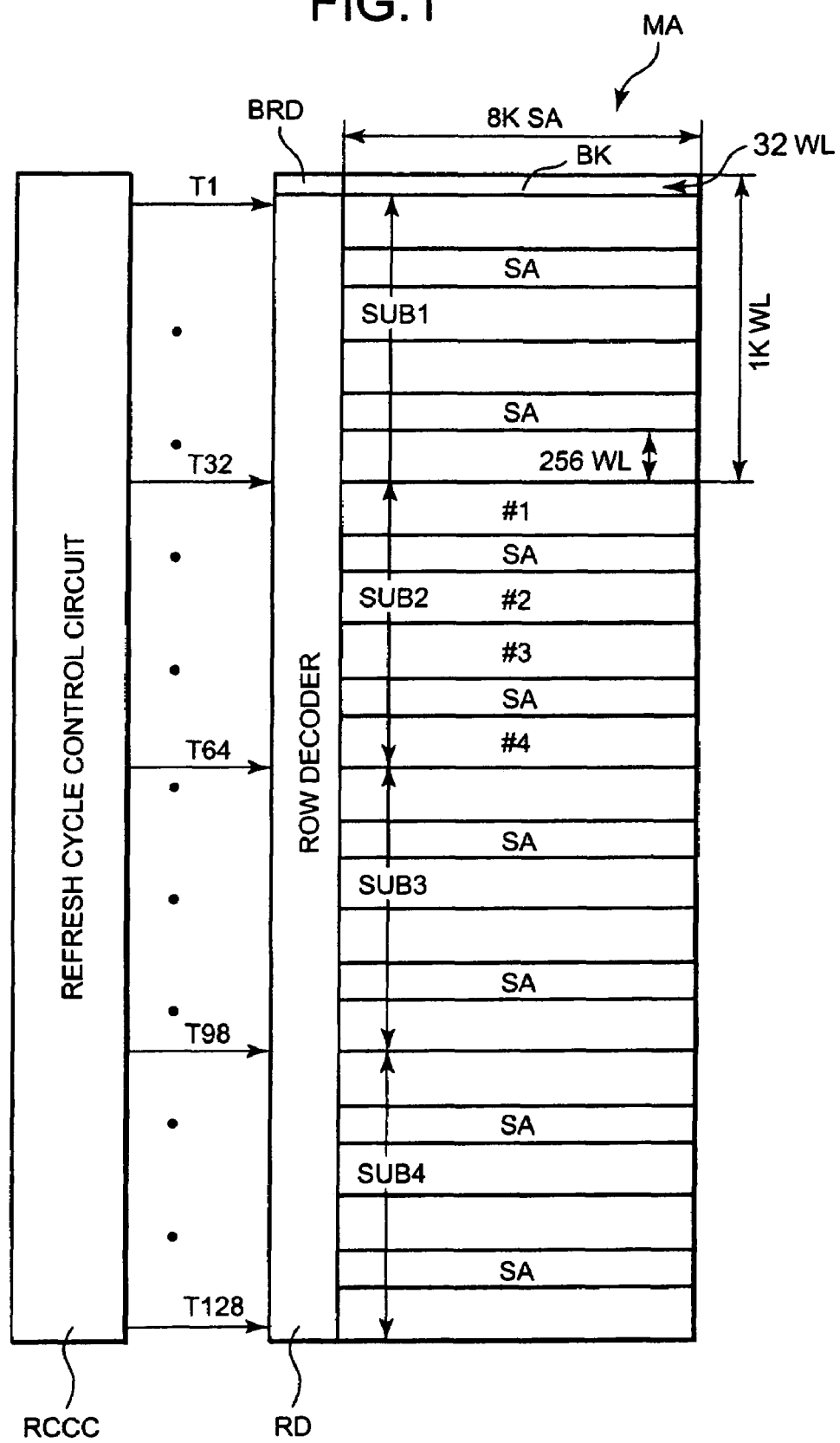
FIG. 1 is a functional block diagram showing the entire configuration of a DRAM in accordance with a first embodiment of the present invention.

Referring to the accompanying drawings, embodiments of the present invention will be explained in detail. The like or equivalent components in the drawings will be assigned like reference numerals and the description thereof will be reused.

Referring to FIG. 1, a DRAM in accordance with a first embodiment of the present invention has a 32-Mbit memory cell array MA, a row decoder RD, and a refresh cycle control circuit RCCC. The memory cell array MA is divided into four subarrays SUB 1 through SUB 4. Each of the subarrays SUB 1 through SUB 4 includes 8M ($=8\times 2^{20}$) memory cells (not shown) disposed in rows and columns, 1K ($=2^{10}$) word lines WL disposed in rows, 8K ($=8\times 2^{10}$) bit line pairs BL disposed in columns, and 8K sense amplifiers SA provided in association with the bit line pairs BL.

Each of the subarrays SUB 1 through SUB 4 is further divided into four regions #1 through #4, each of regions #1 through #4 including 256 word lines WL. The 4K sense amplifiers SA out of the 8K are disposed between regions #1 and #2 and another 4K sense amplifiers SA are disposed between regions #3 and #4. The entire memory cell array MA is further divided into 128 blocks BK, each block BK including 32 word lines WL.

To match the 128 blocks BK, the row decoder RD is divided into 128 block row decoders BRD. Each block row decoder BRD selects one of the 32 word lines WL in its associated block BK. The refresh cycle control circuit RCCC sets refresh cycles T1 to T128 suited to the 128 blocks BK.

Figure 2:
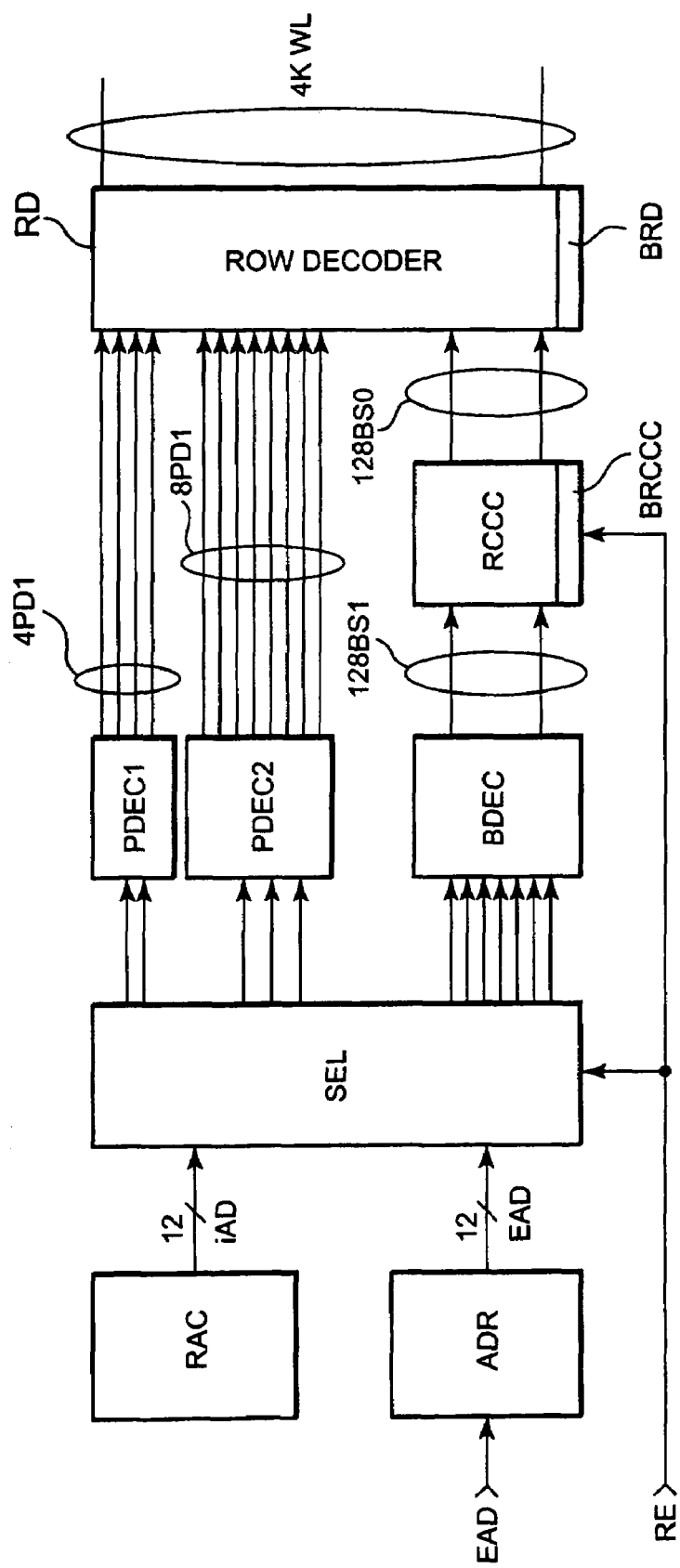
FIG. 2 is a functional block diagram showing the configuration of a peripheral circuit including a row decoder and a refresh cycle control circuit shown in FIG. 1.

Referring to FIG. 2, the DRAM further includes an address receiver ADR, a row address counter RAC, a selector SEL, predecoders PDEC1 and PDEC2, and a block decoder BDEC. This embodiment shares the same construction as that of a conventional DRAM except for the provision of the refresh cycle control circuit RCCC.

The address receiver ADR receives an input external row address signal EAD and supplies it to the selector SEL. The row address counter RAC internally generates an internal row address signal IAD and supplies it to the selector SEL. Each of the external row address signal EAD and the internal row address signal IAD is composed of 12 bits, because a single word line WL must be identified among the 4K word lines WL in the entire memory cell array MA.

In response to a refresh enable signal RE, the selector SEL selects either the external row address signal EAD from the address receiver ADR or the internal row address signal IAD from the row address counter RAC. The refresh enable signal RE is set to L (logical low) level in a normal access mode, while it is set to H (logical high) level in a refresh mode. If the refresh enable signal RE is logic low (L) level, then the selector SEL selects the external row address signal EAD. If the refresh enable signal RE is logic high (H) level, then the selector SEL selects the internal row address signal IAD. The selector SEL supplies the lower two bits (1st and 2nd bits) of the selected row address signal to the predecoder PDEC1, the next lower three bits (3rd through 5th bits) to the predecoder PDEC2, and upper seven bits (6th through 12th bits) to the block decoder BDEC.

The predecoder PDEC1 decodes the 2-bit row address signal to generate a 4-bit ($=2^2$) pre-decode signal PD1, which is supplied to the row decoder RD. The predecoder PDEC2 decodes the 3-bit row address signal to generate an 8-bit ($=2^3$) pre-decode signal PD2, which is supplied to the row decoder RD. The block decoder BDEC decodes a 7-bit row address signal to generate a 128-bit ($=2^7$) block selection signal BSI, which is supplied to the refresh cycle control circuit RCCC.

The refresh cycle control circuit RCCC divides the block selection signal BSI by a predetermined frequency dividing ratio to set a refresh cycle for a block BK. To be more specific, when the refresh enable signal RE is L level, the refresh cycle control circuit RCCC supplies the 128-bit block selection signal BSI as it is to the row decoder RD. In other words, the refresh cycle control circuit RCCC divides the block selection signal BSI by a frequency dividing ratio of 1. If the refresh enable signal RE is H level, then the refresh cycle control circuit RCCC divides the 128-bit block selection signal BSI by a preset frequency dividing ratio (e.g., 1/2 or 1/4) and supplies the result to the row decoder RD.

The refresh cycle control circuit RCCC is divided into 128 block refresh cycle control circuits BRCCC to deal with the 128-bit block selection signal BSI.

When the refresh enable signal RE is L level, each of the block refresh cycle control circuits BRCCC supplies a corresponding 1-bit block selection signal BSI as it is to a corresponding block row decoder BRD. When the refresh enable signal RE is H level, each of the block refresh cycle control circuits BRCCC divides its corresponding 1-bit block selection signal BSI by a preset frequency dividing ratio and supplies the result to its corresponding block row decoder BRD.

Hereinafter, a block selection signal input to the refresh cycle control circuit RCCC will be referred to as "input block selection signal BSI," and a block selection signal output from the refresh cycle control circuit RCCC will be referred to as "output block selection signal BSO." A specific circuit configuration of the refresh cycle control circuit RCCC will be discussed later.

The row decoder RD selects one of the 128 blocks BK in response to a 128-bit output block selection signal BSO, and also selects one of 32 word lines WL in the selected block BK and activates the selected word line WL in response to the pre-decode signals PD1 and PD2.

More specifically, in the row decoder RD, one of the 128 block row decoders BRD is selected in response to the 128-bit output block selection signal BSO, and the selected one is activated. The activated block row decoder BRD selects four from among the 32 word lines WL in a corresponding block BK in response to an 8-bit pre-decode signal PD2, and further selects one from among the four word lines WL in response to the 4-bit pre-decode signal PD1.

Figure 3:
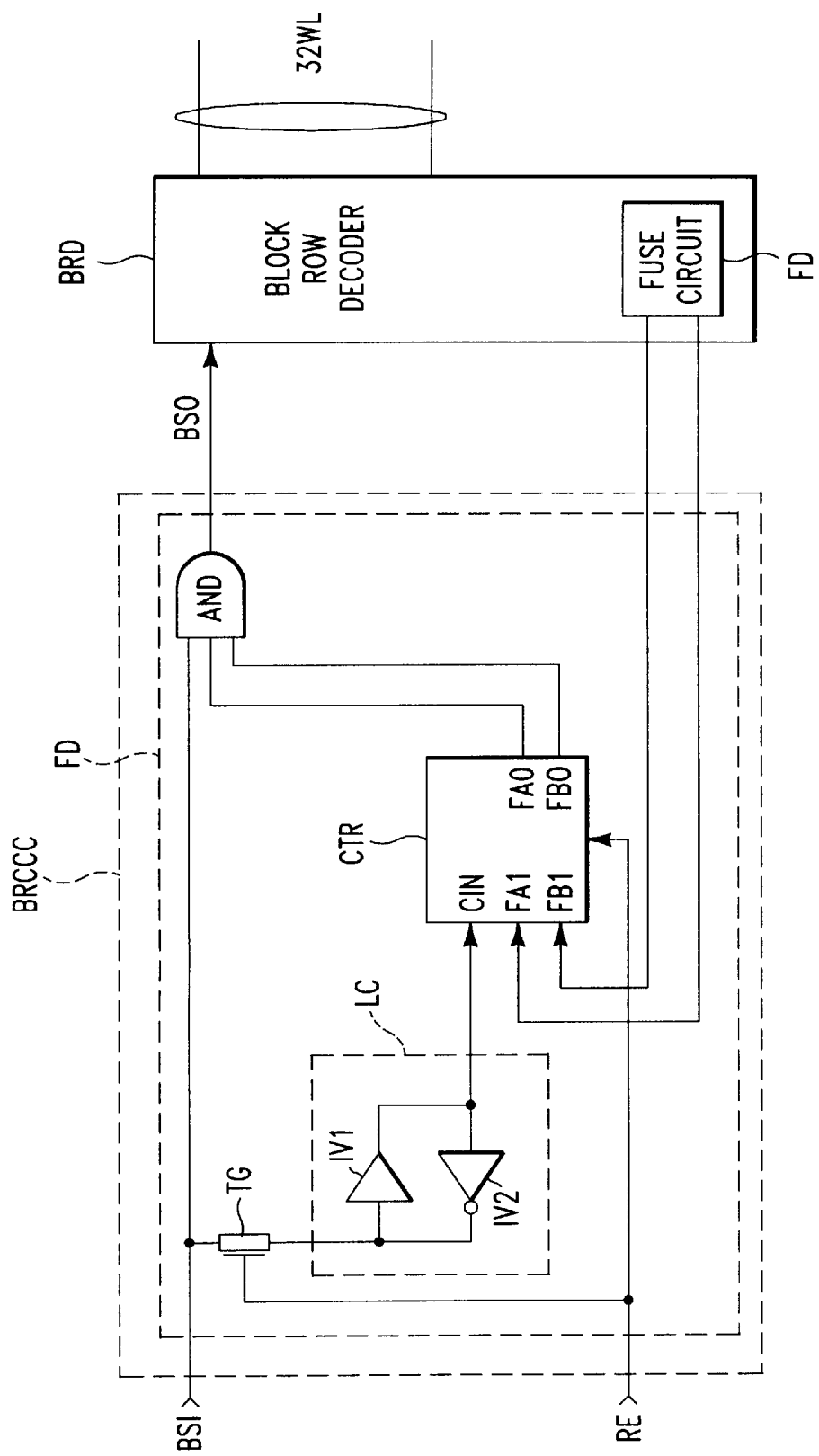
FIG. 3 is a functional block diagram showing the configuration of a block refresh cycle control circuit shown in FIG. 2.

FIG. 3 shows a configuration of the block refresh cycle control circuit BRCCC associated with one block row decoder BRD. Referring to FIG. 3, the block refresh cycle control circuit BRCCC has a fuse circuit FC for setting desired frequency dividing ratios and a frequency divider FD for dividing the block selection signals BSI by frequency dividing ratios set by the fuse circuit FC. The entire refresh cycle control circuit RCCC has 128 block refresh cycle control circuits BRCCC shown in FIG. 3.

Figure 4:
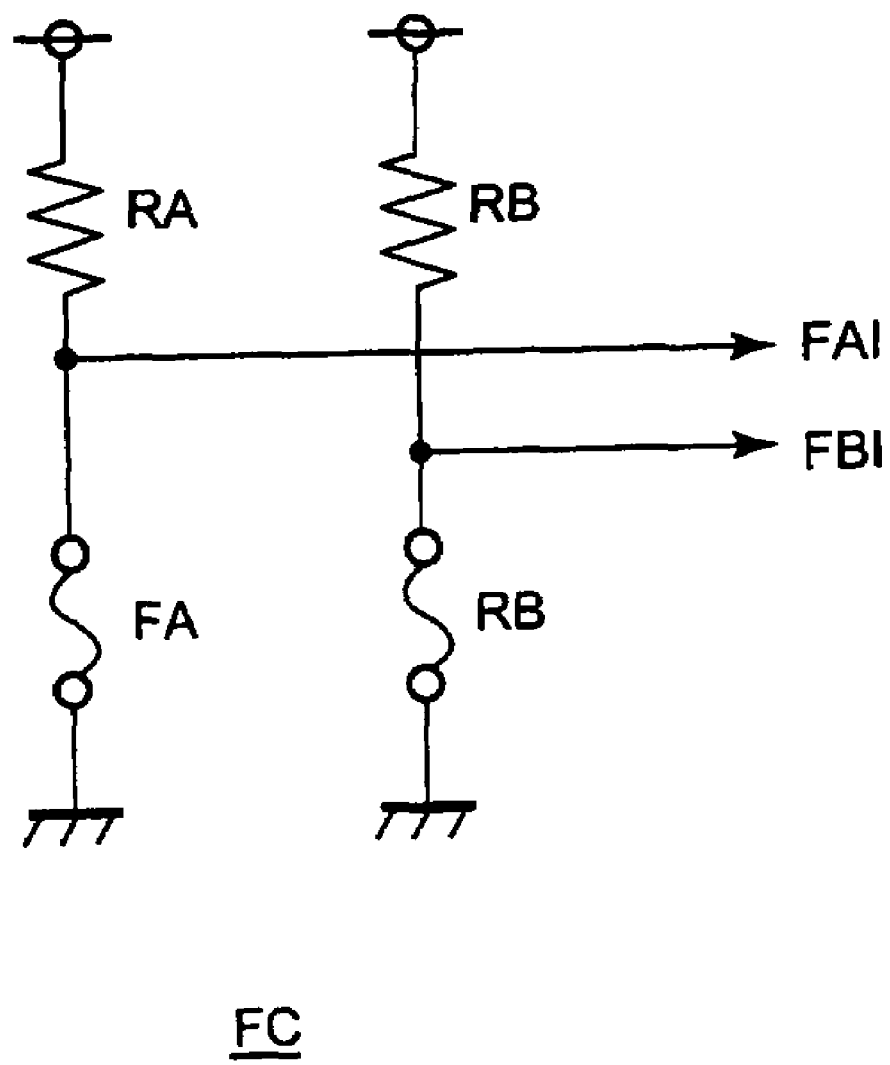
FIG. 4 is a circuit diagram showing the configuration of a fuse circuit shown in FIG. 3.

Referring now to FIG. 4, the fuse circuit FC has pull-up resistors RA and RB, and fuses FA and FB made of polysilicon or the like. If the fuses FA and FB are not OFF, then fuse signals FAI and FBI are both set to L level by the fuses FA and FB, respectively. If only the fuse FA is cut OFF, only the fuse signal FAI is switched to H level by the pull-up resistor RA. If both fuses FA and FB are cut off, then the fuse signals FAI and FBI are both set to H level by the pull-up resistors RA and RB, respectively.

The fuse circuit FC includes the pull-up resistors RA and RB and fuses FA and FB formed of polysilicon or the like. The fuse circuit FC does not include a MOS transistor, so that it is formed on the row decoder RD. This makes it possible to constrain an increase in the chip area when the fuse circuit FC is added.

Referring back to FIG. 3, the frequency divider FD has a transfer gate TG, a latching circuit LC, a counter CTR, and an AND (logic product) gate AND. The transfer gate TG turns on when the refresh enable signal RE is H level, while it turns off when the refresh enable signal RE is L level. The latching circuit LC is formed of interconnected inverters IV1 and IV2. When the refresh enable signal RE is H level, the transfer gate TG supplies the input block selection signal BSI to the latching circuit LC. The latching circuit LC latches the input block selection signal BSI and inverts it into a counter input signal CIN and supplies the counter input signal CIN to the counter CTR.

The counter CTR is incremented in response to the counter input signal CIN and issues 2-bit counter output signals FAO and FBO. The counter output signal FAO is the least significant bit (LSB), while the counter output signal FAB is the most significant bit (MSB).

The counter CTR is activated when the refresh enable signal RE is H level, while it is deactivated when the refresh enable signal RE is L level. The counter CTR is also deactivated when the fuse signals FAI and FBI are both L level. The deactivated counter CTR fixes both counter output signals FAO and FBO at the H level. The activated counter CTR is incremented at each falling edge of the counter input signal CIN. If the fuse signal FAI is H level and the fuse signal FBI is L level, then the counter CTR fixes the counter output signal FAO of the MSB at the H level and functions as a 1-bit counter. If the fuse signals FAI and FBI are both H level, then the counter CTR functions as a 2-bit counter.

The operation of the DRAM will now be described.

The data retention time is measured for each block BK during a retention test, and the fuses FA and FB of a block BK that has passed a 256-ms retention test are both cut off. For a block BK that has passed a 128-ms retention test although it has failed the 256-ms retention test, only the fuse FA is cut off. For other blocks BK, that is, the blocks that have failed both retention tests, none of the fuses FA and FB are cut off.

(1) Normal Access Mode

In the normal access mode, the refresh enable signal RE is L level. Hence, the selector SEL selects the external row address signal EAD. For all 128 blocks BK, the counter CTR fixes both counter output signals FAO and FBO at the H level, thus causing the AND gate AND to directly supply the input block selection signal BSI to the block row decoder BRD as the output block selection signal BSO. Hence, the refresh cycle control circuit RCCC directly supplies the 128-bit input block selection signal BSI to the row decoder RD as the 128-bit output block selection signal BSO. Thus, the DRAM operates in the same manner as the conventional DRAMs without the refresh cycle control circuit RCCC.

(2) Refreshing Mode

In the refresh mode, the refresh enable signal RE is H level. This causes the selector SEL to select the internal row address signal IAD. The refresh cycle control circuit RCCC implements different functions, depending on whether the fuses FA and FB are cut off or not.

Figure 5:
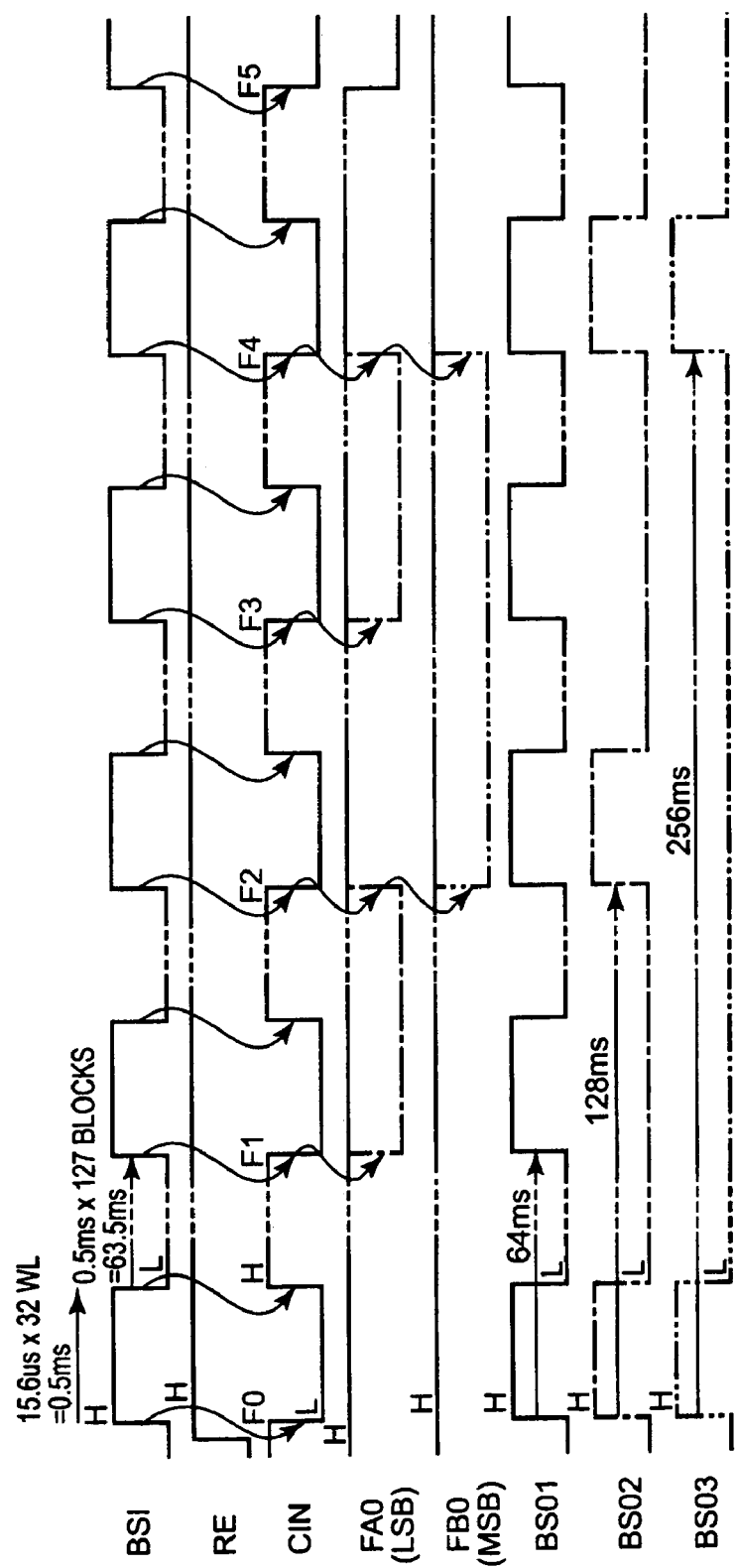
FIG. 5 is a timing chart showing a burst refresh operation of the DRAM shown in FIGS. 1 to 4.

Taking burst refresh as an example, the operation will be explained with reference to FIG. 5. The burst refresh activates all 4K word lines WL in order to refresh all 32M memory cells.

(2.1) If None of the Fuses FA and FB are Cut Off

Attention will be focused on one particular block among the 128 blocks BK. In the block refresh cycle control circuit BRCCC associated with the block BK of interest, the fuse signals FAI and FBI are both L level if none of the fuses FA and FB are cut off. This deactivates the counter CTR, fixing both counter output signals FAO and FBO at the H level. Accordingly, the AND gate AND directly supplies the input block selection signal BSI to the block row decoder BRD as an output block selection signal BSO1.

The input block selection signal BSI remains H level for 0.5 ms, so that the output block selection signal BSO1 will also remain H level for 0.5 ms. During this 0.5-ms period of time, the block row decoder BRD activates each of the 32 word lines WL for 15.6 µs in order so as to refresh all memory cells in the block BK of interest. Upon completion of the refresh, the input block selection signal BSI is switched to the L level. While the input block selection signal BSI remains L level, the input block selection signal BSI is set to the H level for 0.5 ms for each of the 127 blocks other than the block BK of interest. Each block takes 0.5 ms, so that 127 blocks take 63.5 ms (=0.5 ms×127). As a result, for the block BK of interest, the input block selection signal BSI and the output block selection signal BSO1 are switched back to the H level and the refresh is resumed in 64 ms following the start of the first refresh.

In this case, therefore, all memory cells in the block BK of interest are refreshed at 64-ms intervals as normal.

(2.2) If the Fuse FA is Cut Off

If only the fuse FA is cut off in the block refresh cycle control circuit BRCCC associated with the block BK of interest, then the fuse signal FAI is switched to the H level, while the fuse signal FBI is switched to L level. This causes the counter CTR to fix the counter output signal FAO of the MSB at the H level and to function as a 1-bit counter. Meanwhile, the transfer gate TG has been turned on in response to the H-level refresh enable signal RE, so that the latching circuit LC supplies the counter input signal CIN, which is obtained by inverting the input block selection signal BSI, to the counter CTR. The counter CTR is incremented at falling edges F1 to F5 of the counter input signal CIN, causing the counter output signal FAO of LSB to be repeatedly switched between the L and H levels accordingly. While the counter output signal FAO is L level, the logic gate AND fixes an output block selection signal BSO2 at the L level. In other words, while the counter output signal FAO is L level, the H-level input block selection signals BSI are decimated and will not appear in the output block selection signal BSO2. Thus, the cycle of the output block selection signal BSO2 will be 128 ms, which is double the cycle of the input block selection signal BSI.

In this case, therefore, all memory cells in the block BK of interest are refreshed at the 128-ms interval, which is double that of normal cycle.

(2.3) If Both Fuses FA and FB are Cut Off

If both fuses FA and FB are cut off in the block refresh cycle control circuit BRCCC associated with the block BK of interest, then both fuse signals FAI and FBI are both set to the H level. This causes the counter CTR to function as a 2-bit counter. The counter output signal FAO of MSB is repeatedly switched to the L or H level at each rising edge of the counter output signal FBO of LSB. While the counter output signal FAO or FBO is L level, the AND gate AND fixes the output block selection signal BSO3 at the L level. More specifically, while the counter output signal FAO or FAB is L level, input block selection signals BSI at the H level are decimated and do not appear in the output block selection signal BSO3. Hence, the cycle of the output block selection signal BSO3 will be 256 ms, which is four times the cycle of the input block selection signal BSI.

In this case, therefore, all memory cells in the block BK of interest are refreshed at the intervals of 256 ms, which is four times the normal cycle.

The counter CTR is incremented at the falling edges F1 to F5 of the counter input signal CIN, and reset at a falling edge F0 of the first counter input signal CIN since the refresh enable signal RE is switched to the H level, causing both counter output signals FAO and FBO to be H level. Hence, the first refresh is performed for safety whenever a refresh mode is set even if neither the fuse FA nor FB has been cut off.

As described above, according to the present embodiment, the retention test is conducted for each block BK, and the 256-ms refresh cycle is set for the blocks BK that have passed the 256-ms retention test. A 128-ms refresh cycle is set for the blocks BK that have passed a 128-ms retention test, while a 64-ms refresh cycle is set for other blocks BK. Thus, the refresh current will be reduced to a quarter in the blocks BK for which the 256-ms refresh cycle is set, and the refresh current will be reduced to a half in the blocks BK for which the 128-ms refresh cycle is set. Moreover, different refresh cycles suited to the 128 blocks BK can be set, allowing more detailed settings of refresh cycle to be accomplished. The advantage can be obtained merely by adding the simple refresh cycle control circuit RCCC to a conventional DRAM.

In the above embodiment, the number of blocks: is 128, and the refresh cycles are twice and quadruple of 64 ms; however, the present invention is not particularly limited to these numbers. For instance, if the counter CTR is 3-bit, then an 8-fold refresh cycle will be obtained, or if the counter CTR is 4-bit, then a 16-fold refresh cycle will be obtained, thus expanding the selectable range of refresh cycles.

According to the present embodiment, refresh current Ir is usually given by expression (1) below:

$$Ir = Ib \times F2/Nb + Ib/2 \times F4/Nb + Ib/4 \times (Nb - F2 - F4)/Nb \quad (1)$$

where Ib denotes a basic refresh current when the refresh cycle is set to 64 ms, Fn denotes the number of blocks failing a retention test of n×64 ms, and Nb is the total number of blocks.

If it is assumed that 12 blocks have failed the 128 ms retention test, and 26 blocks have failed the 256 ms retention test, the refresh current Ir in this case is given by expression (2) below:

$$Ir=Ib\times12/128+Ib/2\times26/128+Ib/4\times(128-12-26)/128=Ib\times(12/128+1/2\times26/128+1/4\times(128-12-26)/128)=0.371Ib \quad (2)$$

The refresh current Ir in this case will be almost one third of that in the case where the refresh cycle is uniformly set to 64 ms.

Figure 6:
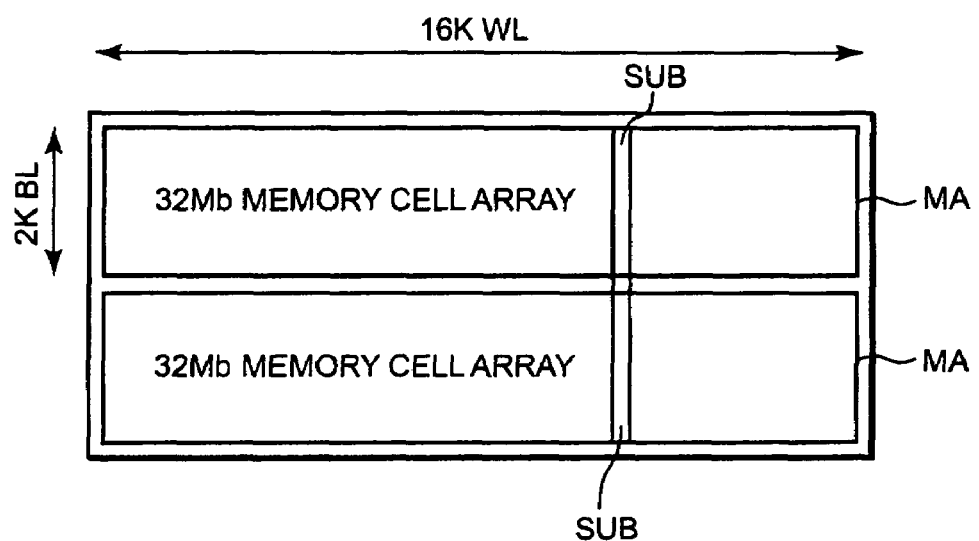
FIG. 6 is a functional block diagram showing the entire configuration of a DRAM according to a second embodiment of the present invention.

Referring to FIG. 6, a DRAM according to a second embodiment of the present invention has two memory cell arrays MA. Each memory cell array MA includes 32M memory cells (not shown) arranged in rows and columns, 16K word lines WL arranged in rows, and 2K bit line pairs BL arranged in columns. Each memory cell array MA has 32-Mbit memory capacity. The entire DRAM has a 64-Mbit memory capacity. Each memory cell array MA is divided into 64 subarrays SUB, each subarray SUB having 512-Kbit memory capacity.

Figure 7:
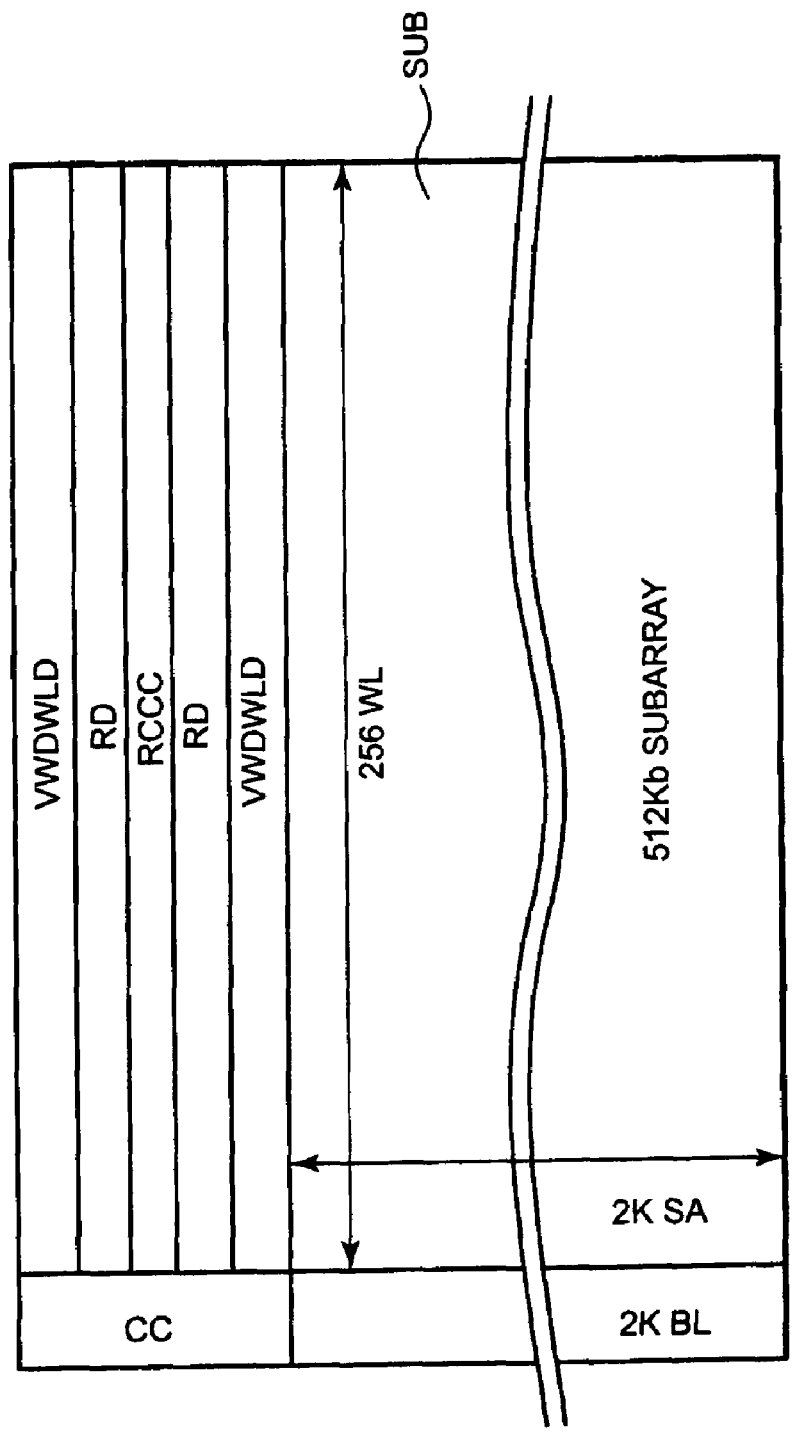
FIG. 7 is a functional block diagram showing the configurations of a subarray shown in FIG. 6 and its peripheral circuit.

Referring to FIG. 7, each subarray SUB has 512K memory cells (not shown), 256 word lines WL, and 2K bit line pairs BL. 2K sense amplifiers SA are individually connected to the 2K bit line pairs BL.

As shown in FIG. 7, a row-based peripheral circuit is disposed between the two, upper and lower, memory cell arrays MA shown in FIG. 6. The row-based peripheral circuit has a refresh cycle control circuit RCCC, two row decoders RD, two virtual word line decoder and word line drivers (hereinafter referred to simply as "word line drivers") VWDWLD, and a control circuit CC.

The refresh cycle control circuit RCCC is provided at the middle of the upper and lower subarrays SUB, the details of which will be discussed below. The row decoders RD are disposed, one each, on both sides of the refresh cycle control circuit RCCC. The upper row decoder RD selects the word line WL located in the upper subarray SUB in response to a predecode signal. The lower row decoder RD selects the word line WL located in the lower subarray SUB in response to a predecode signal. The predecode signals are supplied from a predecoder.

The predecoder not shown in the present embodiment is basically identical to the predecoders PDEC1 and PDEC2 in the first embodiment shown in FIG. 2. The predecoder decodes a row address signal and generates a predecode signal. As a row address signal, an external row address signal supplied from outside at the time of an access is normally used, while an internal row address signal internally generated is used in the refresh mode.

The word line drivers VWDWLD are provided outside the row decoders RD. The upper word line driver VWDWLD drives word lines WL selected by the upper row decoder RD, while the lower word line driver VWDWLD drives word lines WL selected by the lower row decoder RD. One drive operation simultaneously actuates two subarrays SUB, thereby refreshing the 4K memory cells at the same time.

Figure 8:
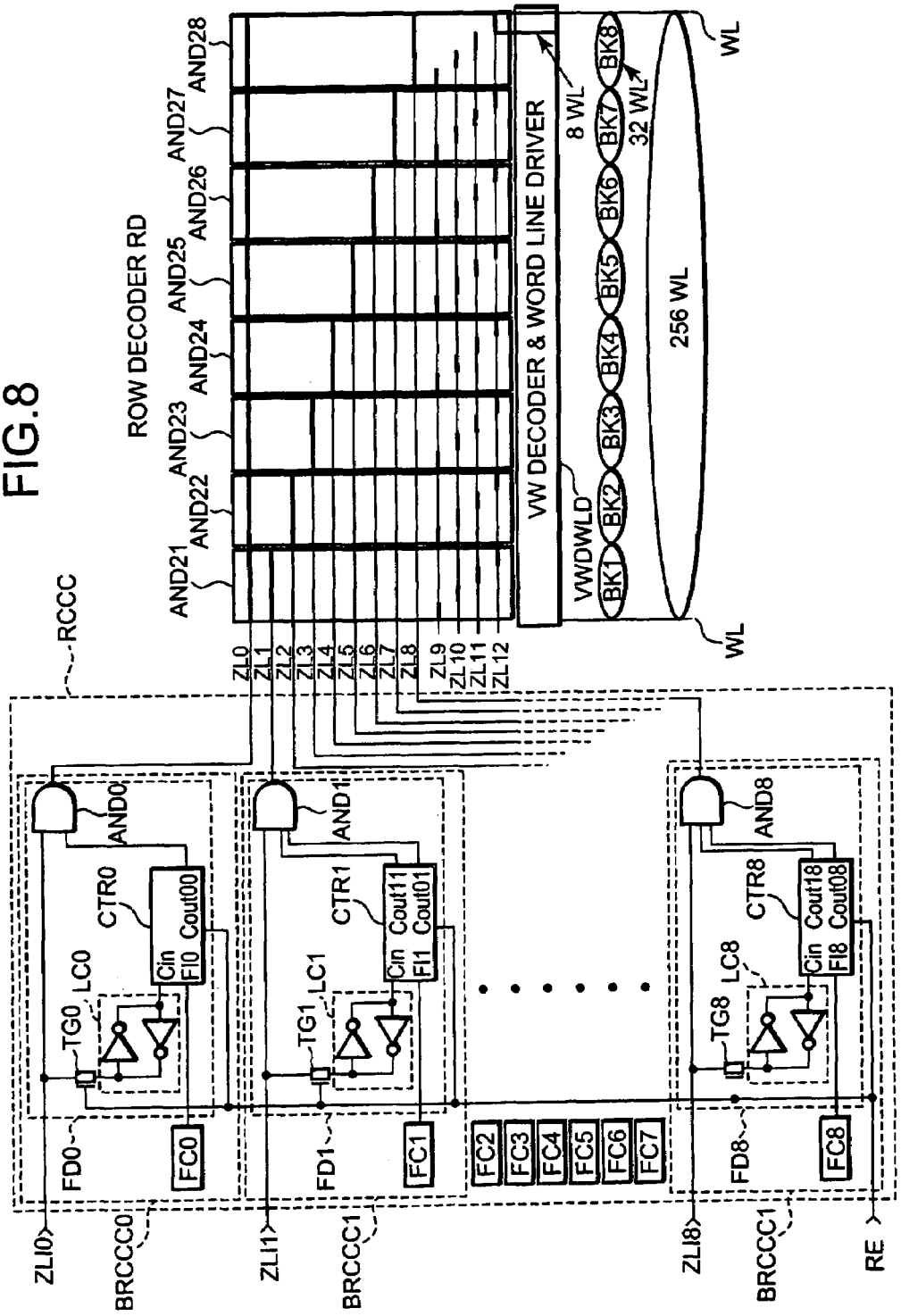
FIG. 8 is a functional block diagram showing the configurations of a refresh cycle control circuit, a row decoder, and a virtual word line decoder and word line driver shown in FIG. 7.

FIG. 8 shows the details of the refresh cycle control circuit RCCC, the row decoders RD, and the word line drivers VWDWLD. The present embodiment shares the same configuration as that of a conventional DRAM except for the provision of the refresh cycle control circuit RCCC.

Referring to FIG. 8, the row decoder RD selects the subarray SUB, i.e., the 256 word lines WL, in response to a predecode signal ZL0. The row decoder RD further selects 32 word lines WL from among the selected 256 word lines WL in response to 8-bit predecode signals ZL1 to ZL8. The subarrays SUB are divided into eight blocks BK1 to BK8. Each of the blocks BK1 to BK8 includes the 32 word lines WL. Each memory cell array MA is divided into 512(=64×8) blocks.

The row decoder RD selects eight word lines WL from among the selected 32 word lines WL in response to 4-bit predecode signals ZL9 to ZL12. To implement the selection, the row decoder RD has eight AND circuits AND 21 to AND 28 constituting an AND tree. For instance, when the predecode signals ZL0, ZL8, and ZL12 are all H level, the AND circuit AND 28 selects corresponding eight word lines WL.

The word line driver VWDWLD turns ON/OFF the power supplied to each word line WL in response to three bits of a row address signal thereby to drive one word line WL among the eight word lines WL selected by the row decoder RD.

The refresh cycle control circuit RCCC sets a 64-ms or 128-ms refresh cycle for the 256 subarrays, and also sets a 64-ms or 256-ms refresh cycle for the 512 blocks. The refresh cycle control circuit RCCC receives nine bits of predecode signals ZLI0 to ZLI8 from the predecoder (not shown) and supplies nine bits of predecode signals ZL0 to ZL8 to the row decoder RD. Hereinafter, the predecode signals input to the refresh cycle control circuit RCCC will be referred to as "input predecode signals" to distinguish them from the predecode signals ZL0 to ZL8 output from the refresh cycle control circuit RCCC.

The refresh cycle control circuit RCCC has nine block refresh cycle control circuits BRCCC0 to BRCCC8 provided in association with the nine bits of predecode signals ZL0 to ZL8. Each block refresh cycle control circuit BRCCi (i=0 to 8) divides an input predecode signal ZLIi by a preset frequency dividing ratio (1, 1/2 or 1/4), and outputs the resulting predecode signal ZLi. Each block refresh cycle control circuit BRCCCi includes a fuse circuit FCi and a frequency divider FDi. Hence, the entire refresh cycle control circuit RCCC has nine fuse circuits FC0 to FC8 and nine frequency dividers FD0 to FD8 provided therefor.

Each fuse circuit FCi has a pull-up resistor (not shown) and a fuse (not shown). More specifically, each fuse circuit FCi has only one system in the fuse circuit FC shown in FIG. 4. Each fuse circuit FCi outputs an L-level fuse signal FIi if its internal fuse is not cut off, whereas it outputs an H-level fuse signal FIi when the internal fuse is cut off. The fuse circuit FC0 sets a frequency dividing ratio of 1 or 1/2. Fuse circuits FC1 to FC8 sets a frequency dividing ratio of 1 or 1/4.

Each frequency divider FDi has a transfer gate Ti, a latching circuit LCi, a counter CTRi, and an AND (logic product) gate ANDi. The configurations and functions of the frequency dividers are identical to those of the frequency divider FD shown in FIG. 3 except for a counter CTRi. The frequency divider FD0 divides the input predecode signal ZLI0 by a frequency dividing ratio set in the fuse circuit FC. The frequency dividers FD1 to FD8 divide the input predecode signals ZLI1 to ZLI8 by the frequency dividing ratios set in the fuse circuits FC1 to FC8.

The counter CTR0 is activated when the refresh enable signal RE is switched to the H level and the fuse signal FI0 is switched to the H level, while it is deactivated when the refresh enable signal RE or the fuse signal FI0 is switched to the L level. The activated counter CTR0 functions as a 1-bit counter, and it is incremented at a falling edge of a counter input signal Cin and outputs a 1-bit counter output signal Cout00. At each rising edge of the input predecode signal ZLI0, the counter output signal Cout00 is repeatedly switched between "0" (L level) and "1" (H level). In this case, therefore, the AND gate AND0 divides the input predecode signal ZLI0 by a frequency dividing ratio of 1/2. The deactivated counter CTR0 fixes the counter output signal Cout00 at the H level. In this case, therefore, the AND gate AND0 directly outputs the input predecode signal ZLI0 as the predecode signal ZL0. In other words, the AND gate AND0 divides the input predecode signal ZLI0 by a frequency dividing ratio of 1.

Counters CTR (i=1 to 8) are activated when the refresh enable signal RE is activated to the H level and a fuse signal FIi is switched to the H level, while it is deactivated when the refresh enable signal RE or the fuse signal FIi is switched to the L level. The activated counter CTRi functions as a 2-bit counter, and it is incremented at a falling edge of the counter input signal Cin and outputs a 2-bit counter output signal Cout1$i$ and Cout0$i$, the counter output signal Cout1$i$ being MSB and the counter output signal Cout0$i$ being LSB. At each rising edge of the input predecode signal ZLIi, the counter output signals Cout1$i$ and Cout0$i$ are repeatedly subjected to the change of "00"→"01"→"10"→ "11". In this case, therefore, the AND gate AND0 divides the input predecode signal ZLIi by a frequency dividing ratio of 1/4. The deactivated counter CTRi fixes both counter output signals Cout1$i$ and Cout0$i$ at the H level. In this case, therefore, the AND gate ANDi directly outputs the input predecode signal ZLIi as the predecode signal ZLi. In other words, the AND gate ANDi divides the input predecode signal ZLIi by a frequency dividing ratio of 1.

Fuse circuits FC0 to FC8 are disposed on the AND tree forming the row decoder RD. The frequency dividers FD0 to FD8 are disposed in the control circuit CC shown in FIG. 7. Using such a layout makes it possible to constrain an increase in the chip area when the refresh cycle control circuit RCCC is added.

An operation of the DRAM will now be described. For a subarray SUB that has passed the 128-ms retention test out of the 64 subarrays SUB, the fuse of the fuse circuit FC0 that corresponds to the subarray SUB is cut off. Furthermore, for a block BKj (j=1 to 8) that has passed the 256-ms retention test out of the 512 blocks, the fuse of a fuse circuit FCj that corresponds to the block BKj is also cut off. For the remaining blocks BKk (k=1 to 8), the fuses of the fuse circuits FCk corresponding to the blocks BKk are not cut off.

(1) Normal Access Mode

In the normal access mode, the refresh enable signal RE is switched to the L level, and all counters CTR0 to CTR8 are deactivated. The counter CTR0 fixes the counter output signal Cout00 at the H level. The counters CTR1 to CTR8 fix the counter output signals Cout11, Cout01 to Cout18, and Cout08 at the H level. This causes the refresh cycle control circuit RCCC to directly supply the input predecode signals ZLI0 to ZLI8 to the row decoder RD as the predecode signals ZL0 to ZL8. The DRAM operates in the same manner as a conventional DRAM not equipped with the refresh cycle control circuit RCCC.

(2) Refresh Mode

Figure 9:
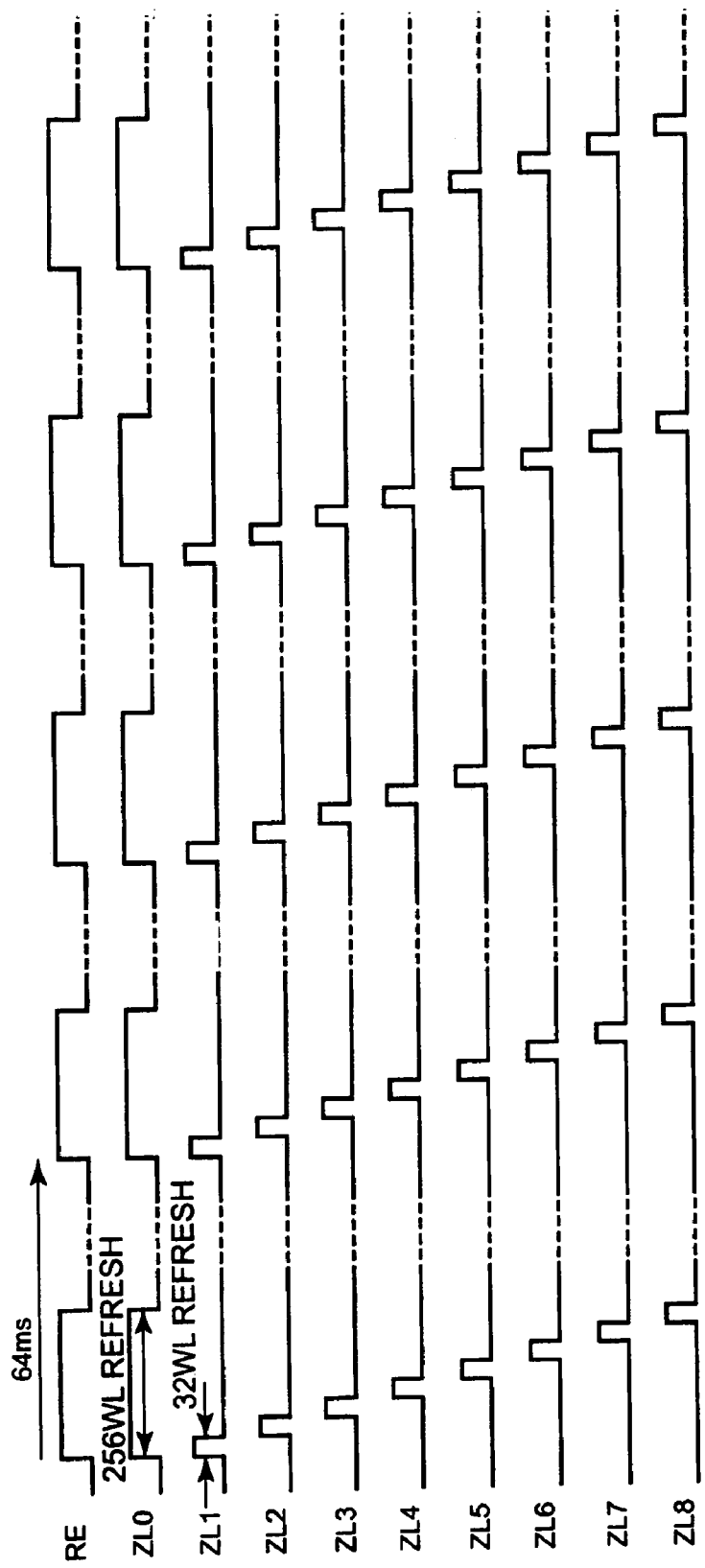
FIG. 9 is a timing chart illustrating the operation performed when none of fuse circuits are cut off in the refresh cycle control circuit shown in FIG. 8.
Figure 10:
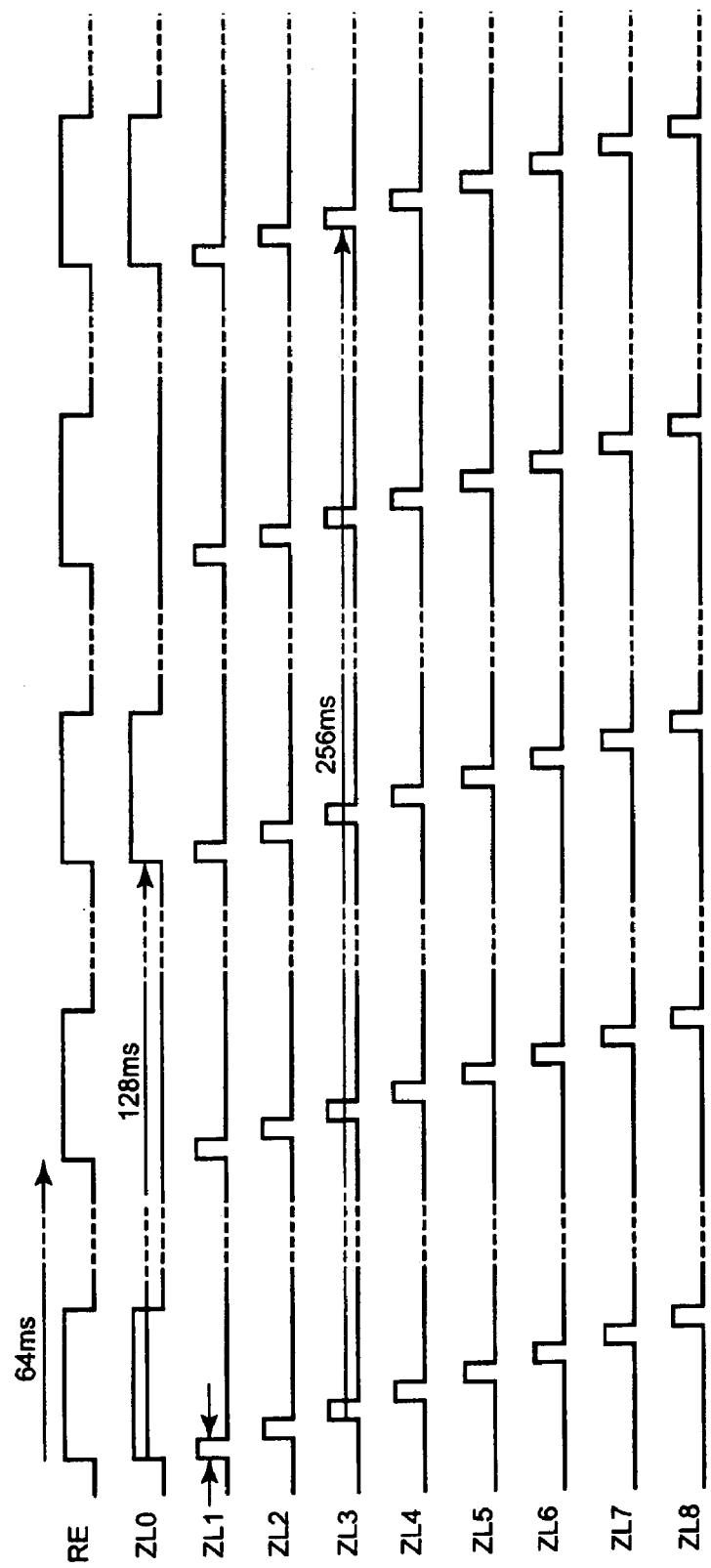
FIG. 10 is a timing chart illustrating the operation performed when fuse circuits FC0 and FC3 are cut off in the refresh cycle control circuit shown in FIG. 8.

The following will explain an operation of the DRAM, taking a burst refresh operation, as an example, with reference to FIGS. 9 and 10.

Burst refresh sequentially selects the 256 word lines WL to refresh all memory cells in a subarray SUB. In the burst refresh mode, the refresh enable signal RE goes to H level at the 64-ms intervals while the 256 word lines are being selected, as shown in FIGS. 9 and 10.

(2.1) When None of Fuse Circuits are Cut Off (FIG. 9)

If none of the fuses of fuse circuits FC0 to FC8 are cut off, then all block refresh cycle control circuits BRCCC0 to BRCCC8 directly supply the input predecode signals ZLI0 to ZLI8 to the row decoder RD as predecode signals ZL0 to ZL8, as shown in FIG. 9. This causes the predecode signal ZL0 to constantly remain at the H level while the refresh enable signal RE is at the H level, and the predecode signals ZL1 to ZL8 to be sequentially switched to the H level. While each predecode signal ZLi (i=1 to 8) is H level, its associated block BKi is selected, and the 32 word lines WL in the block BKi are sequentially selected, thereby refreshing all the memory cells in the block BKi. All the predecode signals ZL1 to ZL8 switch to the H level at the 64-ms intervals, so that all memory cells in the subarray SUB are refreshed at the 64 ms intervals as usual.

(2.2) If Fuse Circuits FC0 and FC3 are Cut Off (FIG. 10)

If a retention test result shows that the data retaining time of all memory cells in the subarray SUB is 128 ms or more, then the fuse of the fuse circuit FC0 is cut off. If the data retaining time of all memory cells in, for example, the block BK 3, is 256 ms or more, then the fuse of the fuse circuit FC3 is cut off.

In this case, as illustrated in FIG. 10, the block refresh cycle control circuits BRCCC1, BRCCC2, and BRCCC4 to BRCCC8 directly supply the input predecode signals ZLI1, ZLI2, and ZLI4 to ZLI8 to the row decoder RD as the predecode signals ZL1, ZL2, and ZL4 to ZL8. The block refresh cycle control circuit BRCCC0 divides the input predecode signal ZLI0 by a frequency dividing ratio 1/2, and the block refresh cycle control circuit BRCCC3 divides the input predecode signal ZLI3 by a frequency dividing ratio 1/4. Thus, the cycle of the predecode signals ZL1, ZL2, and ZL4 to ZL8 remains 64 ms, while the cycle of the predecode signal ZL0 will be 128 ms and the cycle of the predecode signal ZLI3 will be 256 ms.

Since the cycle of the predecode signal ZL0 is 128 ms, the subarray SUB will be selected only at intervals of 128 ms. Therefore, the blocks BK1, BK2, and BK4 to BK8 will not be selected even if the predecode signals ZL1, ZL2, and ZL4 to ZL8 are switched to the H level while the predecode signal ZL0 is L level. As a result, the blocks BK1, BK2, and BK4 to BK8 are refreshed at the 128-ms cycle of the predecode signal ZL0, while the block BK3 is refreshed at the 256-ms cycle of the predecode signal ZL3.

The present embodiment uses eight 3-input AND gates AND1 to AND8. Alternatively, however, eight 4-input AND gates may be used to commonly supply the predecode signal ZL0 output from the AND gate AND0 to the eight 4-input AND gates in place of the row decoder RD. The operation in this case is the same as that described above.

Thus, according to the second embodiment, for a subarray SUB having shortest data retaining time of 128 ms or more, the refresh cycle of the subarray SUB can be set to 128 ms, which is double a standard cycle, by cutting off the fuse circuit FC0. In this subarray SUB, for a block having shortest data retaining time of 256 ms or more, the refresh cycle of the block can be set to 256 ms, which is quadruple the standard cycle, by cutting off its corresponding fuse circuit. Hence, the power consumed for refresh can be reduced in subarrays or blocks having longer refresh cycles than a standard cycle.

According to a conventional method, if the shortest data retaining time of any one of the eight blocks BK1 to BK8 ranges from 128 ms to 256 ms, then the refresh cycle of the entire subarray SUB has to be set to 128 ms even if the shortest data retention time of other blocks is 256 ms or more. According to the present embodiment, the refresh cycles can be hierarchically set in the order of subarrays and blocks, so that only the refresh cycle of the blocks having the shortest data retaining time of 128 to 256 ms can be set to 128 ms, while the refresh cycle of the remaining blocks can be set to 256 ms. This makes it possible to reduce the power consumed for refresh in the remaining blocks, as compared with conventional DRAMs. Moreover, the advantages described above can be obtained simply by adding the refresh cycle control circuit RCCC to a conventional DRAM.

According to the present embodiment, refresh current Ir can be generally given by expression (3) shown below:

$$Ir=Ib \times F2/Nb1+Ib/2\times F4/Nb2+Ib/4\times(Nb2-F4-F2\times Nb2/Nb2)/Nb2 \quad (3)$$

where Ib and Fn denote the same values as those in expression (1) above, and Nbn denotes the total number of blocks applied when retention test is carried out at refresh cycles of n×64 ms.

If it is assumed that 10 blocks out of 64 blocks fail a 128-ms retention test, and 100 blocks out of 512 blocks fail a 256-ms retention test, then refresh current Ir in this case is given by expression (4) below:

$$Ir=Ib\times10/64+Ib/2\times100/512+Ib/4\times(512-100-10\times512/64)/512=Ib\times(10/64+1/2\times100/512+1/4\times332/512)$$
$$=0.416Ib \quad (4)$$

The refresh current in this case will be less than half the refresh current required when only one refresh cycle of 64 ms is set for all blocks.

This, however, is the worst case where none of the 10 blocks failing the 128-ms retention test overlap the 100 blocks failing the 256-ms retention test. If it is assumed that 80 blocks out of the 100 blocks failing the 256-ms retention test are already included in the 10 blocks failing the 128-ms retention test, then only 20 blocks actually fail the 256-ms retention test. Hence, refresh current Ir in this case is given by expression (5) below:

$$Ir=Ib\times(10/64+1/2\times20/512+1/4\times412/512)=0.376Ib \quad (5)$$

Refresh current Ir in this case will be nearly one third of the refresh current required when only one refresh cycle of 64 ms is set for all blocks.

A third embodiment implements the same features as those of the second embodiment described above using a different circuit configuration.

Figure 11:
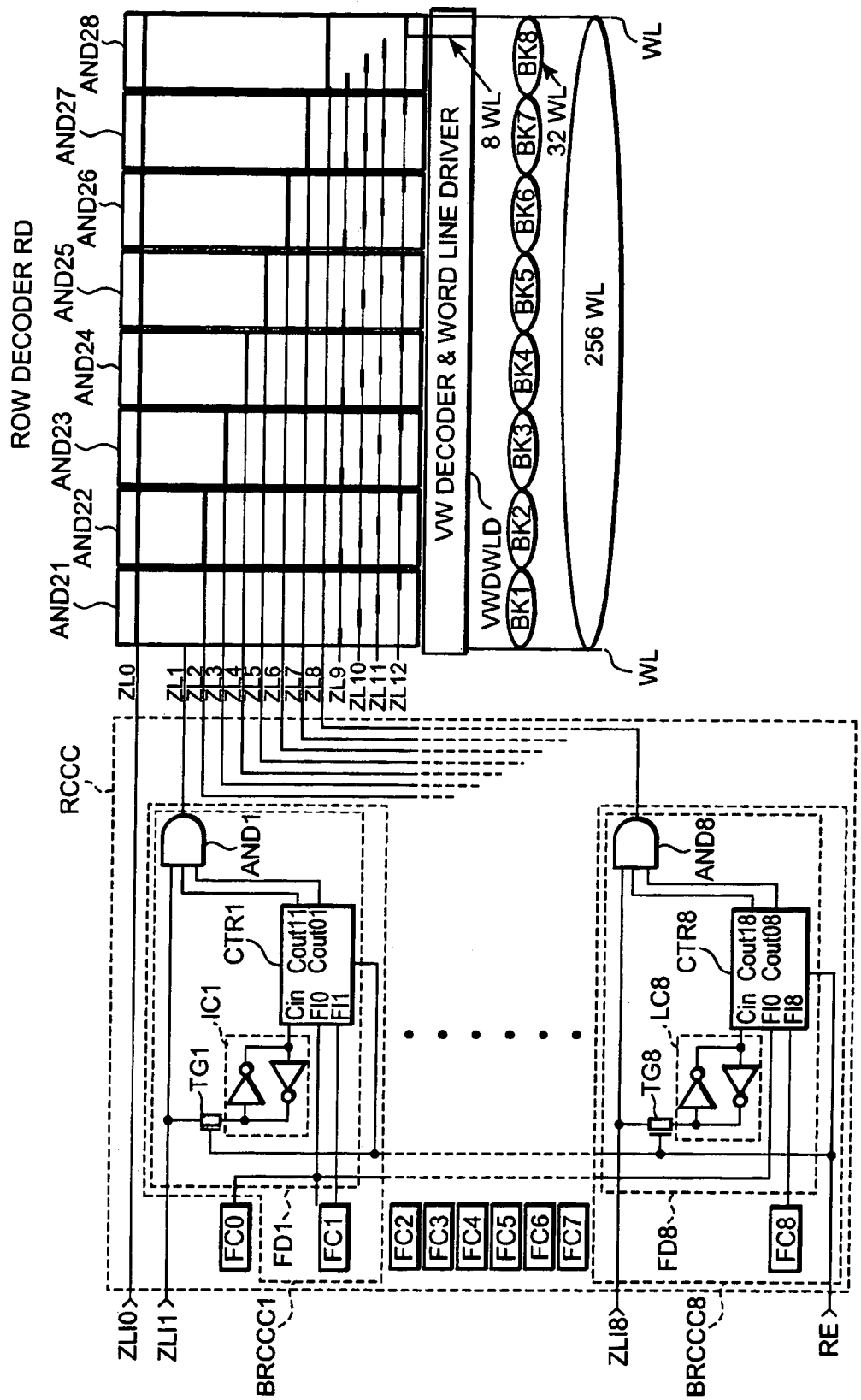
FIG. 11 is a functional block diagram showing the configurations of a refresh cycle control circuit, a row decoder, and a virtual word line decoder and word line driver in a DRAM according to a third embodiment of the present invention.

Referring to FIG. 11, the third embodiment has the fuse circuit FC0, but does not have the frequency divider FD0. Therefore, input predecode signal ZLI0 is always supplied directly to a row decoder RD as a predecode signal ZL0. A fuse signal FI0 output from a fuse circuit FC0 is supplied to all eight counters CTR1 to CTR8. When the fuse circuit FC0 is cut off and a fuse signal FI0 is switched to the H level, the counters CTR1 to CTR8 enable counter output signals Cout01 to Cout08 of LSB. When fuse circuits FC1 to FC8 are cut off and fuse signals FI1 to FI8 are switched to the H level, the counters CTR1 to CTR8 enable counter output signals Cout11 to Cout18 of MSB.

If a retention test result indicates that the shortest data retaining time of all blocks BK1 to BK8 is 128 ms or more, then the fuse circuit FC0 is cut off. If the shortest data retention time of, for example, block BK8 is 256 ms or more, then the fuse circuit FC8 is also cut off. In this case, the counter output signals Cout01 to Cout08 of all the counters CTR1 to CTR8 are enabled in response to the fuse signal FI0 at the H level, and the counter output signal Cout18 of the counter CTR8 is enabled in response to a fuse signal FI8 at the H level. Hence, only the counter CTR8 functions as a 2-bit counter, while the remaining counters CTR1 to CTR7 function as 1-bit counters. Accordingly, only a frequency divider FD8 divides the input predecode signal ZLI8 by a frequency dividing ratio 1/4, and the remaining frequency dividers FD1 to FD7 divide the input predecode signals ZLI1 to ZLI7 by a frequency dividing ratio of 1/2.

Figure 12:
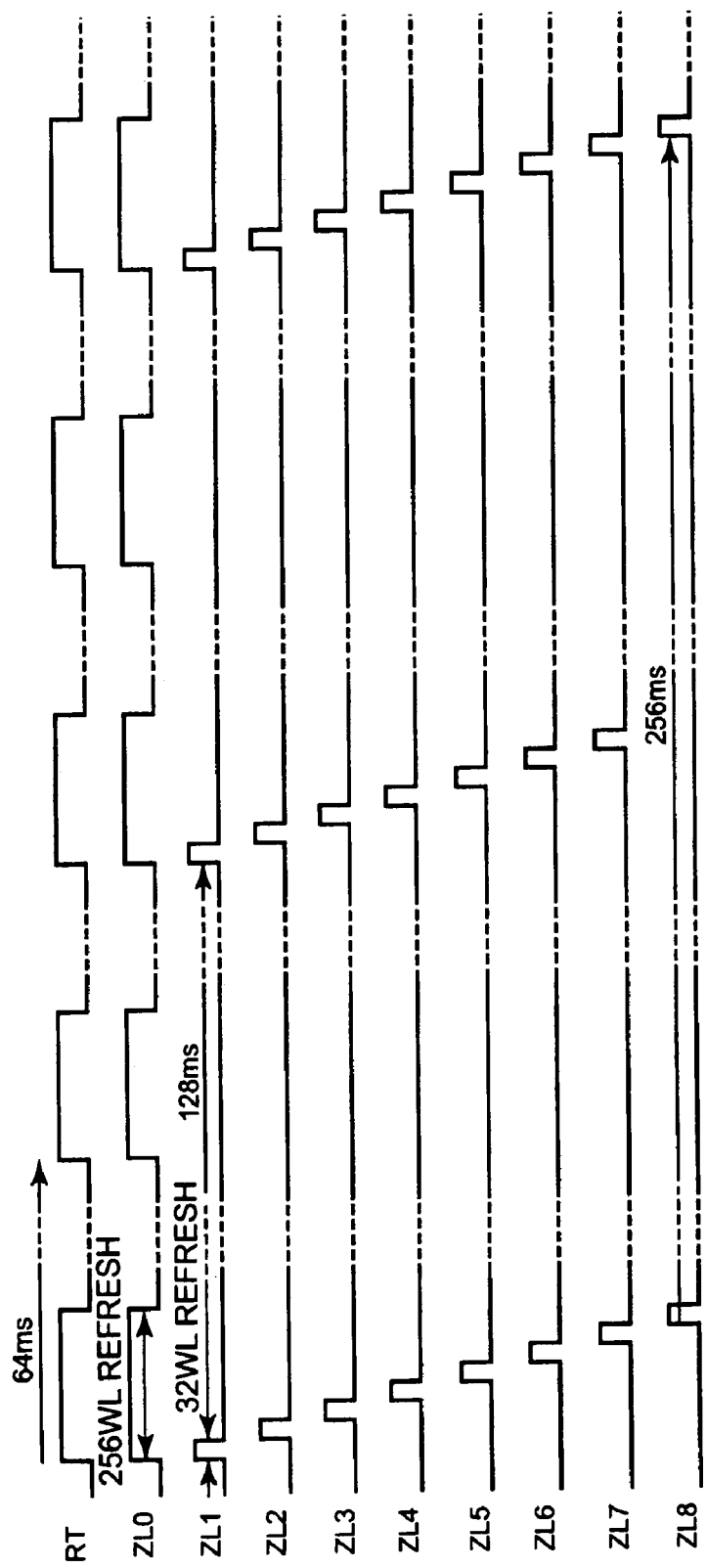
FIG. 12 is a timing chart illustrating the operation performed when fuse circuits FC0 and FC3 are cut off in the refresh cycle control circuit shown in FIG. 11.

Thus, as shown in FIG. 12, the predecode signals ZL1 to ZL7 are switched to the H level at the 128-ms cycle, while the predecode signal ZL8 is switched to the H level at the 256-ms cycle. This causes the blocks BK1 to BK7 to be refreshed at an interval that is double the standard interval and the block BK8 to be refreshed at an interval that is quadruple of the standard interval.

A fourth embodiment has a different block construction from that of the aforementioned third embodiment. In the third embodiment described above, the 32 word lines WL in each block are concentrated at one place, while the word lines WL are divided into four groups, each group containing eight word lines WL in this embodiment.

Figure 13:
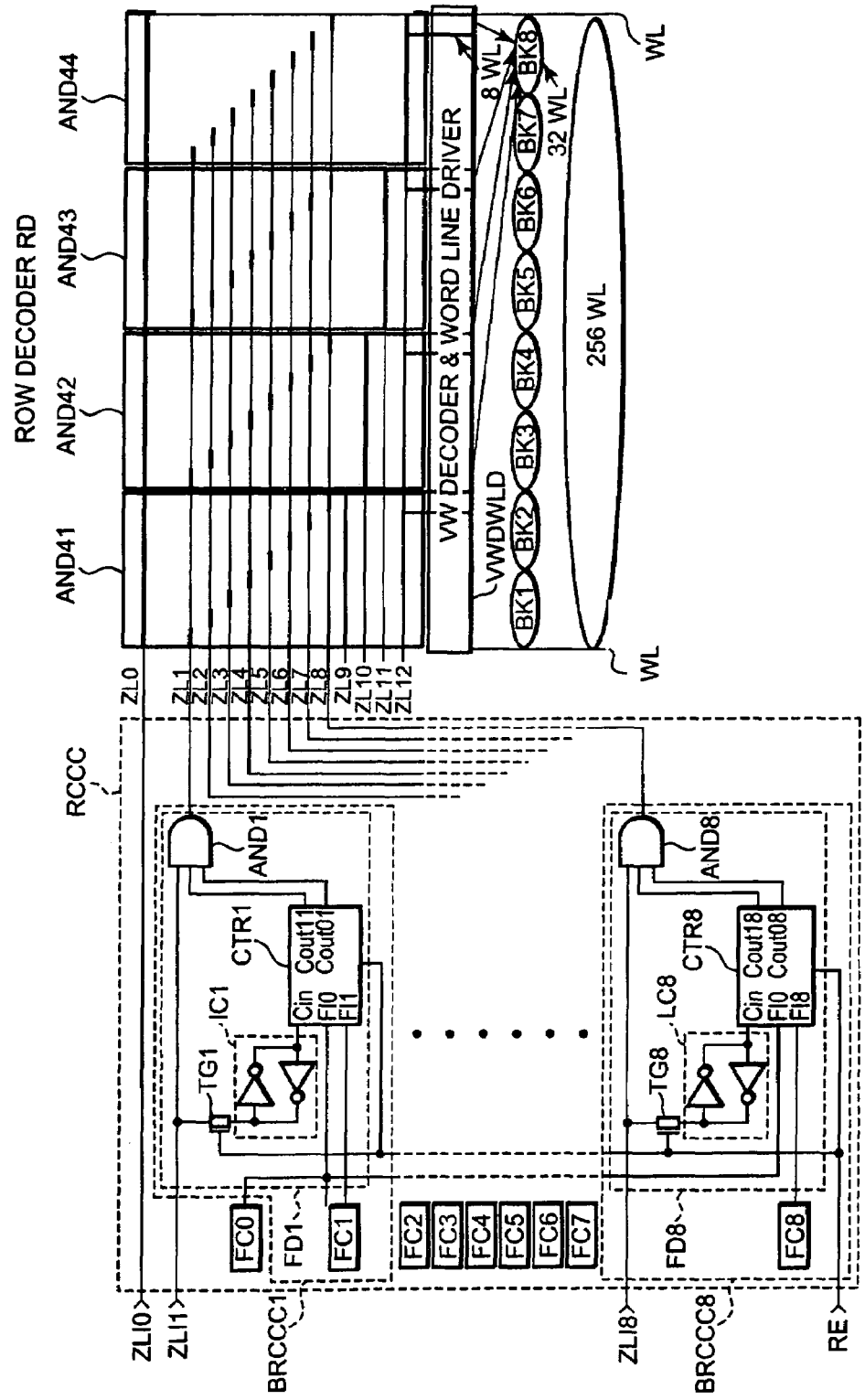
FIG. 13 is a functional block diagram showing the configurations of a refresh cycle control circuit, a row decoder, and a virtual word line decoder and word line driver in a DRAM according to a fourth embodiment of the present invention.

Referring to FIG. 13, a row decoder RD according to the present embodiment is constructed of an AND tree that includes four AND gates AND41 to AND44. The row decoder RD selects 256 word lines WL in response to predecode signal ZL0. The row decoder RD further selects 32 word lines WL from among the selected 256 word lines WL in response to predecode signals ZL1 to ZL8. The row decoder RD further selects eight word lines WL from among the selected 32 word lines WL in response to predecode signals ZL9 to ZL12. When, for example, the predecode signal ZL8 is switched to the H level, each of the AND gates AND41 to AND44 selects its corresponding eight word lines WL. The 32 word lines WL selected at this time constitute the block BK8.

The third embodiment is preferable in a case where memory cells with short data retaining time are concentrated in one place, while the fourth embodiment is preferable in a case where such memory cells are scattered throughout the memory array.

The refresh cycle control circuit RCCC according to the present embodiment is the same as that of the aforementioned third embodiment. Alternatively, however, the refresh cycle control circuit RCCC may be the same as that of the aforementioned second embodiment.

In the second to fourth embodiments, the 128-ms refresh cycle is set by dividing it among the 64 blocks (subarrays), and the 256-ms refresh cycle is set by dividing it among the 512 blocks. However, the number of hierarchies for setting refresh cycles, the type of refresh cycle, the number of blocks, etc. are all examples, and the present invention is not limited thereto. For instance, if the number of counter bits is increased to 3 or 4, then the types of refresh cycles can be increased to 512 ms and 1024 ms.

In the aforementioned two-hierarchical system, nine fuses are provided for every 256 word lines. If two fuses are provided for every 32 word lines, that is, 16 fuses are provided for every 256 word lines, then outputs of 2-bit counters can be enabled. This makes it possible to select three different refresh cycles, namely, 64 ms, 128 ms, and 256 ms for each block constituted by 32 word lines.

Although the present invention has been described with reference to specific embodiments, the embodiments described above are merely examples for implementing the present invention. It is to be understood therefore that the present invention is not limited to the disclosed embodiments. To the contrary, the invention is intended to cover various modifications and equivalent arrangements included within the spirit and scope of the appended claims.

The invention claimed is:

1. A dynamic semiconductor memory device, comprising:
a memory cell array including a plurality of memory cells, the memory cell array being divided into a plurality of blocks;
a block decoder for decoding row address signals and producing block selection signals;
a refresh cycle control circuit, formed on the row decoder, for dividing the block selection signals by preset frequency dividing ratios to set refresh cycles for the blocks, the refresh cycle control circuit having a fuse circuit for setting the frequency dividing ratios and a frequency divider for dividing the block selection signals by frequency dividing ratios set in the fuse circuit; and
a row decoder for selecting the blocks in response to the block selection signals.

2. A method of selectively controlling a refresh cycle time of a dynamic semiconductor memory device, comprising:
dividing a memory cell array including a plurality of memory cells into a plurality of blocks;
decoding row address signals and a plurality of producing block selection signals;
dividing the block selection signals by preset frequency dividing ratios to set refresh cycles for the blocks using a refresh cycle control circuit;
selecting the blocks in response to the block selection signals with a row decoder;
setting the frequency dividing ratios with a fuse circuit;
dividing the block selection signals by frequency dividing ratios set in the fuse circuit using a frequency divider; and
forming the fuse circuit on the row decoder.

* * * * *